United States Patent
Gonda et al.

[11] Patent Number: 6,087,877
[45] Date of Patent: Jul. 11, 2000

[54] INTEGRATED CIRCUIT HAVING SURGE PROTECTION CIRCUIT

[75] Inventors: Tomohiko Gonda; Shigeyuki Kiyota, both of Kanagawa-ken, Japan

[73] Assignee: Nissan Motor Co., Ltd., Kanagawa-ken, Japan

[21] Appl. No.: 09/110,332

[22] Filed: Jul. 6, 1998

[30] Foreign Application Priority Data

Jul. 9, 1997 [JP] Japan ................................ 9-199344

[51] Int. Cl.[7] ................................................ H03K 5/08
[52] U.S. Cl. ............................ 327/309; 327/110; 327/584
[58] Field of Search ................................... 327/108, 110, 327/309, 310, 312, 313, 314, 318, 325, 326, 327, 328, 370, 372, 379, 419, 421, 427, 478, 493, 495, 502, 583, 584

[56] References Cited

U.S. PATENT DOCUMENTS

| | | | |
|---|---|---|---|
| 5,001,373 | 3/1991 | Bator et al. | 307/542 |
| 5,162,966 | 11/1992 | Fujihira | 257/140 |
| 5,500,616 | 3/1996 | Ochi | 327/310 |
| 5,608,595 | 3/1997 | Gourab et al. | 361/79 |
| 5,631,187 | 5/1997 | Phipps et al. | 438/237 |
| 5,731,729 | 3/1998 | Ochi | 327/312 |
| 5,764,088 | 6/1998 | Lavieville et al. | 327/110 |
| 5,793,232 | 8/1998 | Gallinari et al. | 327/110 |

*Primary Examiner*—Jeffrey Zweizig
*Attorney, Agent, or Firm*—McDermott, Will & Emery

[57] ABSTRACT

A trailing edge of a control signal of a transistor controller for controlling an output transistor is detected by an edge detector of a clamp controlling circuit. A surge voltage from a back electromotive voltage induced in an inductance L1 is absorbed from the output transistor, only for a given period immediately after the solenoid is turned off, by turning a switching transistor into an on-state by a timer to force a clamping circuit into conduction. At a normal operation, since the clamping circuit is cut off from an output terminal, the clamping voltage can be set in a manner to reduce to a normal voltage in an IGN-line. Therefore, a peak power value of a power loss caused by the surge voltage at the output transistor can be reduced, whereby generation of heat at the output transistor can be reduced. Therefore, the chip size of the power IC can be reduced.

22 Claims, 11 Drawing Sheets

INTEGRATED CIRCUIT HAVING SURGE PROTECTION CIRCUIT

BACKGROUND OF THE INVENTION

1. Field of the Invention

This invention relates to a semiconductor integrated circuit having an active clamping circuit for protecting a semiconductor element at an output stage from an overvoltage applied externally.

2. Description of the Related Art

A power IC having a transistor at the output stage (hereinafter referred to as "an output transistor"), a driving circuit and/or a controlling circuit for the transistor, and a protection circuit for the transistor, integrated on the same chip, is well known.

It is frequently the case that, a high voltage due to static electricity, a surge voltage induced in an induction load and, irregularity of the load, is supplied to an output terminal of this output transistor as an overvoltage. Therefore, various overvoltage protection circuits protecting the output transistor from these overvoltages have been devised In recent years, the switching speed of the output transistor has become higher and higher. At a turn-off transition of the output transistor, a back electromotive force (voltage) is induced due to the inductance of the load circuit. The back electromotive voltage induced by turning off the current in the inductive load can cause breakdown of the output transistor, since the output transistor is in a high impedance state. Therefore, a countermeasure for this surge voltage has been required.

When a solenoid is used as the load of the output transistor, a back electromotive voltage induced by a process of turning the solenoid off is becoming a problem.

Therefore, a protection circuit which protects the output transistor from the surge voltage caused by this back electromotive voltage has become necessary.

Figure 1:
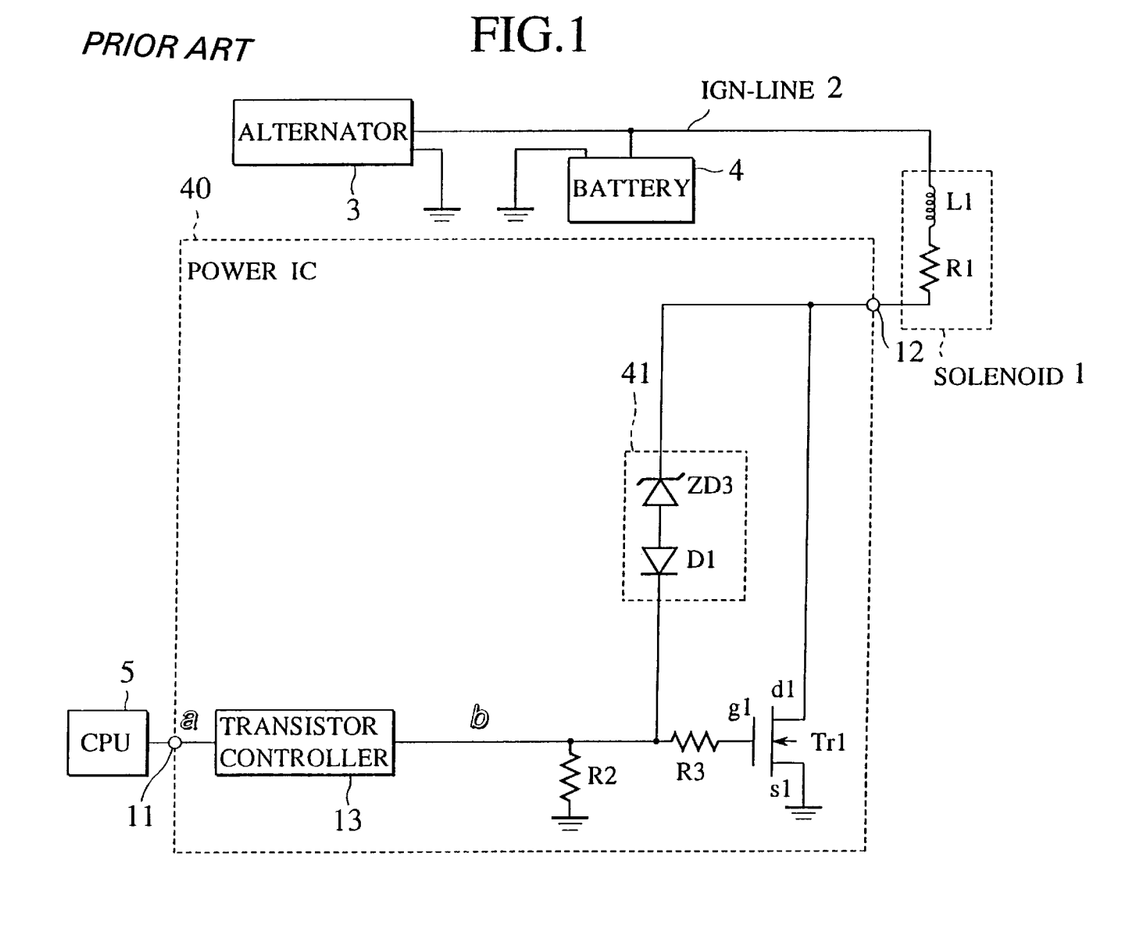
FIG. 1 is a view showing a circuit configuration of a power IC.

FIG. 1 shows a protection circuit for protecting the output transistor. That is, FIG. 1 is one example of an overvoltage protection circuit employing an active clamping circuit in order to protect the output transistor Tr1 from the surge voltage induced by a turn-of-process of a solenoid. The solenoid 1 comprises an inductance component L1 and a resistance component R1, and one terminal thereof is connected to an alternator 3 and a battery 4 through an IGN-line 2, and the other terminal thereof is connected to an output terminal 12 of a power integrated circuit 40 (hereinafter referred to as "a power IC").

The power IC 40 has a transistor controller 13 of the output transistor merged in the same chip with the output transistor Tr1. The transistor controller 13 is driven by a control signal transferred from a CPU through an input terminal 11. The output transistor Tr1 is switched on and off by the transistor controller 13, whereby the solenoid 1, connected to an output terminal of the output transistor Tr1, is driven by the output current from the output transistor. In addition, a clamping circuit 41 and resistors R2 and R3 for protecting the output transistor Tr1 from the surge voltage being supplied from the output terminal 12, are integrated on power IC 40.

The clamping circuit 41 is constituted by a diode D1 and a Zener diode ZD3 connected in series, with the respective anode sides joined together. The input terminal 11 of the power IC 40 is connected to the input of the transistor controller 13 and the output of the transistor controller 13 is connected to the resistance R2, which has the other side thereof grounded. The output of the transistor controller 13 is also connected to the cathode side of the diode D1 of the clamping circuit 41 and to the resistor R3.

The other side of the resistor R3 is connected to a gate g1 of the output transistor Tr1. A drain d1 of the output transistor Tr1 is connected to the output terminal 12 and to the cathode side of the Zener diode ZD3 of the clamping circuit 41. A source s1 of the output transistor Tr1 is grounded.

By this circuit configuration, at the turning off of the output transistor Tr1, the surge voltage induced in the solenoid 1, connected as the load, is supplied to the drain d1 of the output transistor Tr1. The clamping circuit 41 is a protection circuit for preventing the output transistor Tr1 from being broken-down due to this surge voltage. That is, before the output transistor Tr1, being in an off-state, is broken-down, the Zener diode ZD3 of the clamping circuit 41 is conducted, whereby the potential of the gate g1 of the output transistor Tr1 is increased. Therefore, the output transistor Tr1 turns on, whereby the current, due to the surge voltage, flows from the drain d1 of the output transistor Tr1 toward the source s1. As described above, since the output transistor Tr1 turns-on, an excessive high voltage, or the surge voltage, is not supplied between the drain and the source, whereby the output transistor Tr1 is prevented from being broken-down.

At normal operation, the control signal from the transistor controller 13 for turning the output transistor Tr1 on, is transferred to the gate g1. The diode D1 is installed for breaking a current path, flowing from the gate g1 to the side of the drain d1 directly without passing through the output transistor Tr1, when the control signal is transferred to the gate g1.

Figure 2:
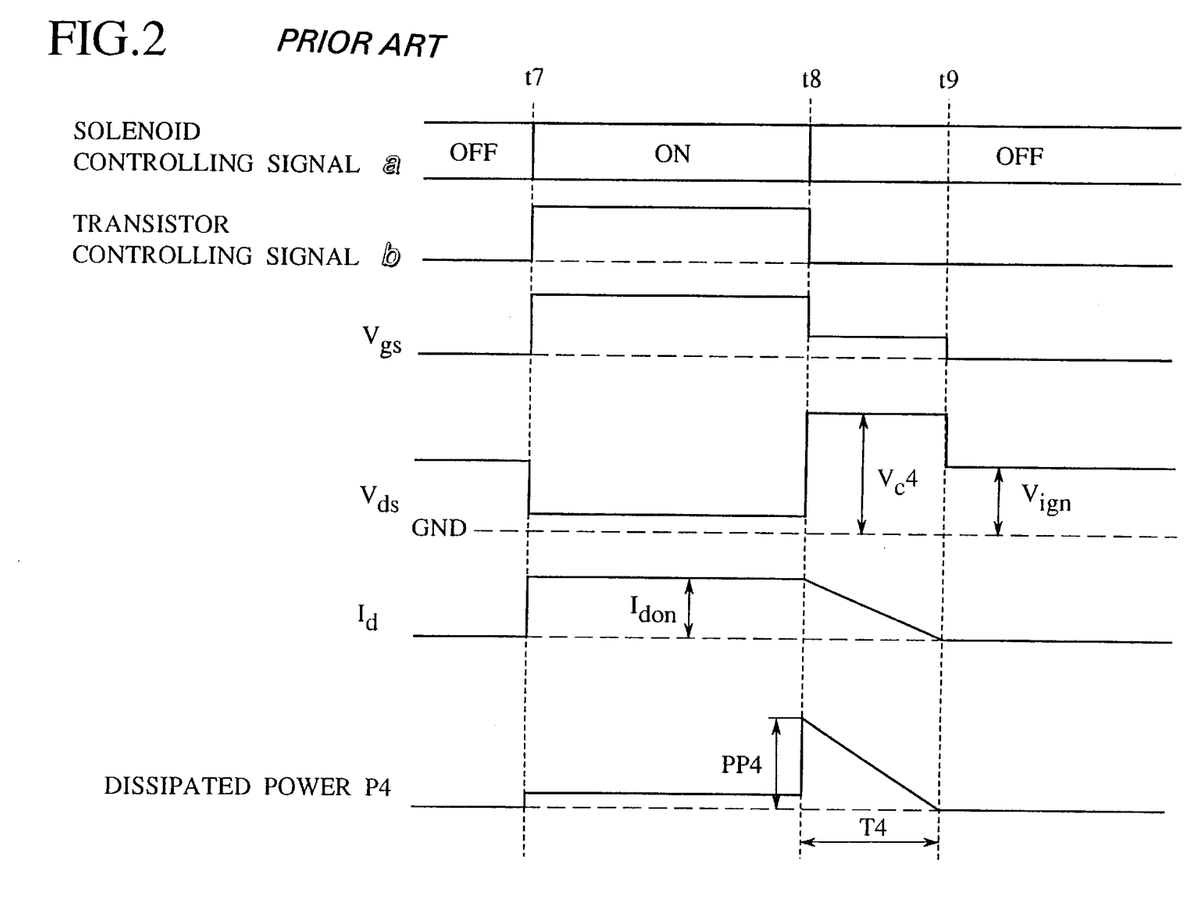
FIG. 2 is a timing chart showing changes of each signal in the circuit configuration shown in FIG. 1.

Next, a detail operation in each portion of the power IC 40 is described using a timing chart in FIG. 2.

When a solenoid controlling signal "a", as shown in FIG. 2, is sent from a CPU 5, the transistor controller 13 sends a transistor controlling signal "b". The transistor controlling signal "b" supplies a gate voltage for turning the output transistor Tr1 to the on-state or the off-state.

At a timing t7 in FIG. 2, when the solenoid controlling signal "a" turns into a "high level", the transistor controlling signal "b" also turns into the "high level", whereby the output transistor Tr1 turns to the on-state. As a result, a drain current $I_d$ flowing between the drain and the source of the output transistor Tr1 flows in the solenoid 1 having the resistance component R1. At this point of time, when defining an on-resistance of the output transistor Tr1 as $R_{on}$ and a normal voltage of an IGN-line as $V_{ign}$, a drain current $I_{don}$ can be represented by $$I_{don} = V_{ign}/(R1 + R_{on}) \qquad (1).$$

Usually, since the on-resistance $R_{on}$ of the output transistor Tr1 and the resistance component R1 of the solenoid 1 are selected so as to be $$R_{on} << R1 \qquad (2),$$

the drain current $I_{don}$ in the on-state of the output transistor Tr1 is considered to be $$I_{don} = V_{ign}/R1 \qquad (3).$$

Since the drain current $I_{don}$ in the on-state of the output transistor Tr1 also is a current which flows in the solenoid 1, an energy Es stored in the solenoid 1 becomes at this time $$Es = 1/2 \cdot L1 \cdot (V_{ign}/R1)^2 \quad (4).$$

Next, at a timing t8 in FIG. 2, when the solenoid controlling signal "a" is switched from an on-signal to an off-signal, the transistor controlling signal "b" also turns to a "low level", whereby the output transistor Tr1 turns to the off-state. When the output transistor Tr1 turns to the off-state, a back electromotive voltage is induced in the solenoid 1, and this voltage is supplied to the output terminal 12 of the power IC 40 as the surge voltage.

This surge voltage is clamped by a Zener voltage $V_z3$ of the Zener diode ZD3, a forward voltage $V_d1$ of the diode D1 and a gate threshold voltage $V_{gs}$ (th) of the output transistor Tr1. Accordingly, a clamping voltage $V_c4$ becomes $$V_c4 = V_z3 + V_d1 + V_{gs}(\text{th}) \quad (5).$$

As shown in FIG. 2, a voltage $V_{gs}$ between the gate and the source of the output transistor Tr1 is reduced instantaneously at the timing t8 when the transistor controlling signal "b" turns to the "low level" and the output transistor Tr1 turns to the off-state. But immediately afterward, the clamping circuit 41 is conducted by the back electromotive voltage induced in the solenoid 1, whereby a positive voltage is supplied to the gate g1. And when the voltage supplied to the gate g1 exceeds the gate threshold voltage $V_{gs}$ (th), the output transistor Tr1 turns to the on-state again.

A voltage $V_{ds}$ between the drain and the source of the output transistor Tr1 is kept at the clamping voltage $V_c4$ of the surge voltage for a period from the timing t8 to a timing t9, during which the clamping circuit 41 is conducted. Then, the voltage $V_{ds}$ is kept at the IGN-line normal voltage $V_{ign}$, from after the timing t9 at which the surge voltage disappears, so that clamping circuit 41 is not conducted.

Immediately after the solenoid controlling signal "a" is switched from an on-signal to an off-signal, a peak power value PP4 defined as the instantaneous value of a power P4 dissipated by the output transistor Tr1 is given by: (the clamping voltage $V_c4$)×(the drain current $I_{don}$). Then, from the formula (3) and the formula (5), $$PP4 = V_c4 \times I_{don} \quad (6)$$
$$= (V_z3 + V_d1 + V_{gs}(th)) \cdot (V_{ign}/R1)$$

is obtained.

When defining the time which a surge energy $E_s$ is dissipated by the output transistor Tr1 as T4, a power loss $P4_s$ by the surge voltage becomes, from the formula (6), $$P4_s = (T4 \cdot PP4)/2 \quad (7)$$
$$= T4 \cdot (V_z3 + V_d1 + V_{gs}(th)) \cdot (V_{ign}/R1)/2.$$

Since the power loss $P4_s$ and the surge energy Es are equal, the time T4 becomes $$T4 = \{L1 \cdot (V_{ign}/R1)\}/(V_z3 + V_d1 + V_{gs}(th)) \quad (8)$$
$$= L1 \cdot (V_{ign}/R1)^2 / PP4.$$

That is to say, when the peak power value PP4, immediately after a solenoid current is cut off, is large, the time T4 is short. And when the peak power value PP4 is small, the time T4 is long.

Figure 3:
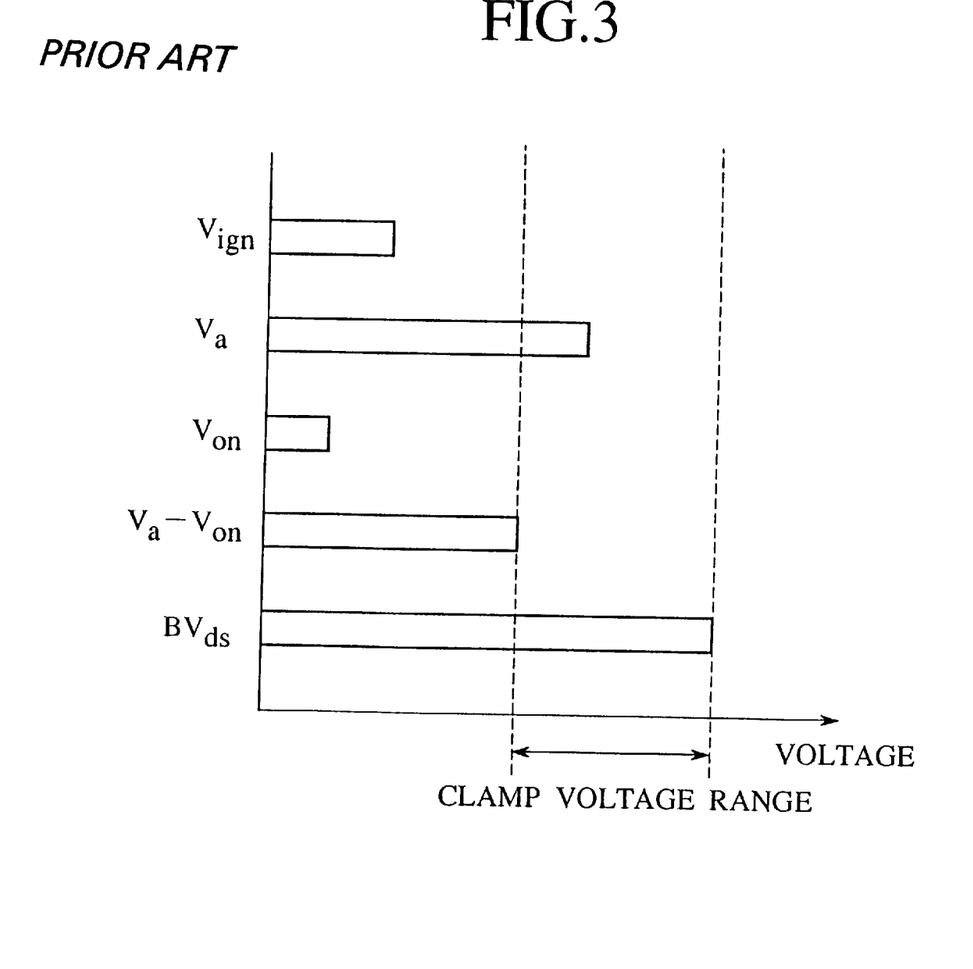
FIG. 3 is a view illustrating a range of a clamp voltage in a power IC shown in FIG. 1.

Next, a range of the clamping voltage $V_c4$ is described using FIG. 3. As shown in FIG. 1, the IGN-line 2 is connected to the battery 4 and the alternator 3. Moreover, usually, the voltage of the battery 4 is supplied to the IGN-line 2. However, when the positive terminal of the battery 4 is disconnected by some reason, an overvoltage $V_a$ from the alternator 3, exceeding the IGN-line normal voltage $V_{ign}$, is supplied to the IGN-line 2 directly.

By this overvoltage $V_a$ from the alternator 3, the clamping circuit 41 is conducted. If the output transistor Tr1 were turned on by the clamping circuit 41, the solenoid 1 would fail to function properly. Accordingly, while the output transistor Tr1 is in an off-state, a specific bias condition such that the output transistor Tr1 can not be turned on by this overvoltage $V_a$ from the alternator 3 is generally employed. Namely, the clamping voltage $V_c4$ is set so as to be $$V_c4 > V_a - V_{on}, \quad (9),$$

wherein $V_{on}$ is an on-voltage of the solenoid 1.

Moreover, if the clamping voltage $V_c4$ were higher than a breakdown voltage $BV_{ds}$ between the drain and the source of the output transistor Tr1, the output transistor Tr1 would be destroyed by the surge voltage induced in the solenoid 1. Therefore, the clamping voltage $V_c4$ should be lower than the breakdown voltage $BV_{ds}$ of the output transistor Tr1. That is, the clamping voltage $V_c4$ is set so as to be $$V_c4 < BV_{ds} \quad (10).$$

Accordingly, from the formula (9) and the formula (10), the range of the clamping voltage $V_c4$ becomes $$V_a - V_{on} < V_c4 < BV_{ds} \quad (11).$$

Based on the above description, using the formula (5) and the formula (11), by setting the forward voltage $V_d1$ of the diode D1 and the Zener voltage $V_z3$ of the Zener diode ZD3 so as to be $$V_a - V_{on} < V_z3 + V_d1 + V_{gs}(th) < BV_{ds} \quad (12),$$

the clamping circuit 41 can protect the output transistor Tr1 from destruction due to the overvoltage.

SUMMARY OF THE INVENTION

In recent years, because of functional improvements in electronic equipment and the need to install various components having miscellaneous functions, the requirement to reduce the size of the semiconductor chip for an integrated circuit has increased.

However, when the feature size of the semiconductor integrated circuit is minimized, and the chip size becomes smaller and smaller, a heat dissipation effect of the semiconductor integrated circuit will inevitably shrink. Since the heat generated by a semiconductor element is transported away from the chip surface to a heat sink through material such as adhesives, a decrease of the heat dissipation effect results in thermal runaway of the device. In particular, generation of heat at the output stage of a power semiconductor element whose power loss is large is one of the factors interfering with chip size reduction of the semiconductor integrated circuit.

When the power loss of a semiconductor element is large, it is natural that increase in the junction temperature becomes large. However, when the power loss is the same amount, the generation of heat in a power semiconductor element is influenced by a peak power value of the power loss.

A relationship between the peak power value of the power loss in the output transistor Tr1 and the generation of heat of the output transistor Tr1 is described in accordance with the surge voltage induced in the solenoid 1.

The clamping voltage $V_c4$ is set within the range shown in the formula (11) by the overvoltage $V_a$ of the alternator, the on-voltage $V_{on}$ of the solenoid 1, and the breakdown voltage $BV_{ds}$ between the drain and the source of the output transistor Tr1.

Here, we define a peak power value where the clamping voltage $V_c4$ is the difference $(V_a-V_{on})$ between the overvoltage $V_a$ of the alternator and the on-voltage $V_{on}$ of the solenoid 1 as PP4a, and a peak power value where the clamping voltage $V_c4$ is the breakdown voltage $BV_{ds}$ between the drain and the source as PP4b. Then, the peak power value PP4 becomes $$PP4a < PP4 < PP4b \tag{13}$$

Then, let us assume that the power loss is the same amount. When the peak power value PP4 is large while the dissipation time T4 of power loss is small, the heat dissipation effect by the thermal conduction is less, and the substrate temperature (or the junction temperature) of the power IC 40 is increased by a large amount. On the other hand, when the peak power value PP4 is small while the dissipation time T4 of power loss is large, the heat dissipation effect by the thermal conduction is large, and the increase of the junction temperature of the power IC 40 is suppressed. Accordingly, when defining the increased substrate temperature of the power IC 40 for the peak power value PP4a as $T_e4a$, and the increased substrate temperature of the power IC 40 for the peak power value PP4b as $T_e4b$, the increased substrate temperature $T_e4$ of the power IC 40 becomes $$T_e4b < T_e4 < T_e4b \tag{14}$$

Figure 4A:
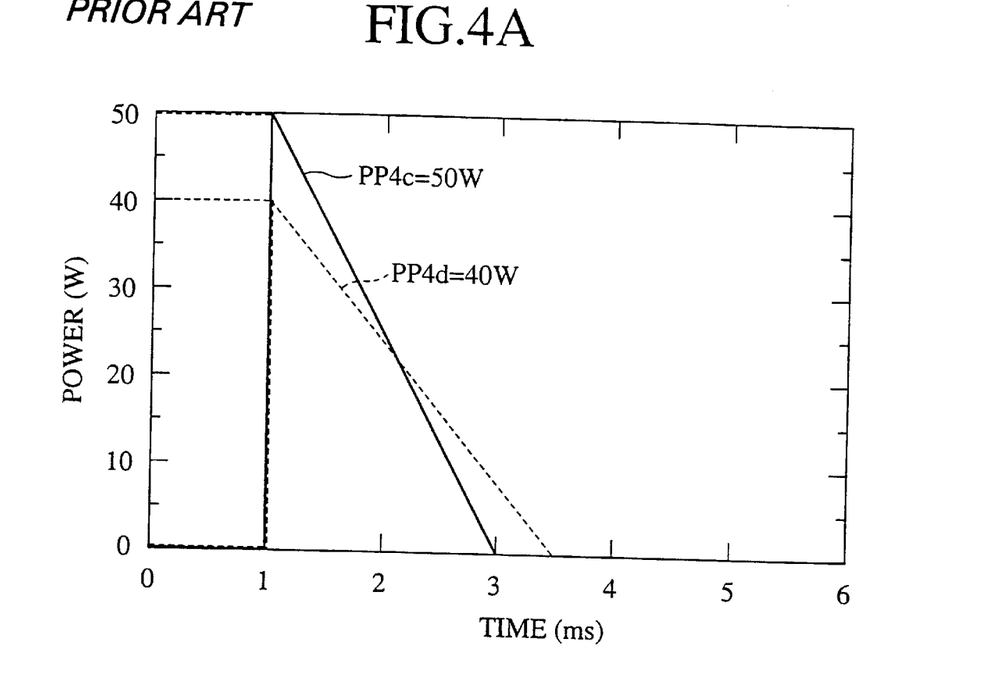
FIG. 4A is a view showing changes with time on two different peak power values.
Figure 4B:
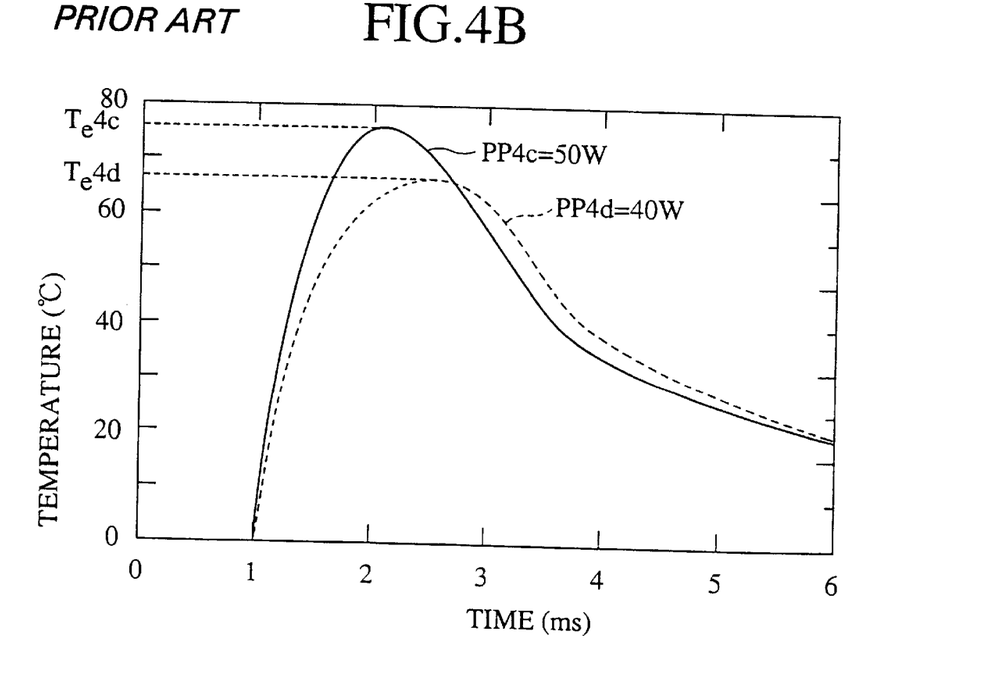
FIG. 4B is a view showing changes with time of the increase in substrate temperature of a semiconductor integrated circuit on two peak power values shown in FIG. 4A.

In FIGS. 4A and 4B, supposing two peak power values PP4c and PP4d for which total surge energy are equal and the peak power values are different, the calculated results on each of these PP4c and PP4d are shown. FIG. 4A shows changes with time of the power dissipated by the transistor and FIG. 4B show changes with time of the junction temperature of the transistor. Both surge energies are supposed as 50 mJ per 1 mm². As shown in FIG. 4B, when the peak power value PP4c is 50 W and the time T4c is 2 ms, the substrate temperature $T_e4c$ becomes 75° C. On the other hand, when the peak power value PP4d is 40 W and the time T4d is 2.5 ms, the substrate temperature $T_e4c$ becomes 66° C.

In the conventional surge protection circuit, a range, capable of setting a clamping voltage of the clamping circuit, is narrow as shown in formula (12). Therefore, the peak power values PP4 of the power loss dissipated in the power semiconductor element at output stage are limited within a narrow range. Thus, the increase in the junction temperature of the power IC can not be reduced as shown in FIG. 4B. Accordingly, for improving heat dissipation, the cross-sectional area available for the flow of heat inevitably has to be enlarged to reduce the thermal resistance. Therefore, the chip size-reduction of the conventional semiconductor integrated circuit is hindered.

In view of such problems, the object of this invention is to provide a semiconductor integrated circuit having an active clamping circuit for protecting an output semiconductor element from overvoltage supplied to an output terminal.

A further object of this invention is to provide a semiconductor integrated circuit in which an overvoltage protection for an output semiconductor element is ensured, and by which reduction of the chip size is possible.

Another object of this invention is to provide a semiconductor integrated circuit in which a range of the clamping voltage of the clamping circuit is wide so that the peak power value PP4 of an output semiconductor element can be reduced drastically.

An additional object of this invention is to provide a semiconductor integrated circuit by which an output semiconductor element can be protected from breakdown by an overvoltage, even though a power supply of the circuit is in the off-state.

A yet another object of this invention is to provide a semiconductor integrated circuit which can be protected from an overvoltage effectively, even in the case that surge voltages from various causes are supplied, and by which an increase in the degree of on-chip integration can be accomplished.

Therefore, a first feature of the present invention is a semiconductor integrated circuit comprising: at least an output semiconductor element in which a main electrode is connected to an output terminal; a semiconductor element control circuit controlling this output semiconductor element; a clamping circuit connected between the output terminal and a control electrode of the output semiconductor element; and a clamp controlling circuit detecting changes of a control signal of the semiconductor element control circuit to control an operation of the clamping circuit based on detected results. Moreover, "the main electrode" in the first feature of the present invention implies an electrode such as a source electrode and/or a drain electrode of a FET and a collector electrode and/or emitter electrode of a bipolar transistor (BJT). Moreover, the "control electrode" implies an electrode such as a gate electrode of the FET and a base electrode of the BJT.

At this point, the clamping circuit may comprises an edge detector detecting a pulse edge of the output signal of the semiconductor element control circuit and a timer sending a signal controlling the clamping circuit in a certain condition for a given period enough to protect the output semiconductor element after detecting the pulse edge by the edge detector. By providing this timer, the operation of the clamping circuit can be controlled in approximately parallel with a turn-off of the output semiconductor element. A "pulse edge" implies a trailing edge or a leading edge of the output signal of the semiconductor element control circuit, and any one of the trailing edge or the leading edge may be defined in consideration of the polarity of the control electrode of the output semiconductor element. According to the first feature of the present invention, the voltage which the clamping circuit is forced into conduction can be set in a manner to reduce to the normal voltage of the output terminal, whereby the peak power value of the power loss dissipated by the output semiconductor element can be minimized. Therefore, an increase in the junction temperature of the semiconductor integrated circuit can be reduced. The clamping circuit may be constituted by an overvoltage protection element between the output terminal and a control electrode of the output semiconductor element and conducting over the given voltage.

A second feature of the present invention is a semiconductor integrated circuit comprising: at least an output semiconductor element in which a main electrode is connected to an output terminal; a semiconductor element control circuit controlling this output semiconductor element; a clamping circuit connected between the output terminal and a control electrode of the output semiconductor element; and a clamp controlling circuit detecting the voltage of the output terminal to control an operation of the clamping circuit based on the detected voltage. At this point, the clamping circuit may comprises an output voltage monitor measuring a voltage of the output terminal; an edge detector detecting a pulse edge of an output signal of the output voltage monitor; and a timer sending a signal controlling a condition of the clamping circuit for a given period after detecting the pulse edge by this edge detector. Moreover, the clamp controlling circuit comprises preferably a switching element connected between the output terminal and the clamping circuit. Moreover, "the main electrode" in the second feature of the present invention implies the source electrode and/or the drain electrode of the FET and the collector electrode and/or emitter electrode of the BJT, etc. Moreover, "the control electrode" implies the gate electrode of the FET and the base electrode of the BJT, etc.

According to the second feature of the present invention, the voltage which the clamping circuit is forced into conduction can be set in a manner to reduce to the normal voltage of the output terminal, whereby the peak value of the power loss dissipated by the output semiconductor element can be reduced. Therefore, the increase in substrate temperature of the semiconductor integrated circuit can be reduced. Further, the output semiconductor element can be protected from the overvoltage caused by static electricity or the like, even in the case that no changes in the signal from the semiconductor element control circuit is detected.

In the second feature of the present invention, by comprising a switching element connected between the output terminal and the clamping circuit, the clamping circuit can be insulated from the output terminal securely for the period except an off-process turning the output semiconductor element from the on-state to the off-state, whereby, for the period except the clamping operation, reliability of the semiconductor integrated circuit can be improved. Moreover, in the case that this switching element is provided with an overvoltage protection element in series, the output semiconductor element can be protected from overvoltage supplied to an output terminal, even though the clamp controlling circuit does not operate.

Moreover, as "the output semiconductor element" in the first and the second features of the present invention, various semiconductor elements such as a Double-diffused MOSFET (DMOS), a V-grooved MOSFET (VMOS), an U-grooved MOSFET (UMOS), a BJT, an Insulated Gate bipolar transistor (IGBT), a Static Induction Transistor (SIT), a Static Induction Thyristor (SI Thyristor), a MOS-Controlled Thyristor (MCT), an Emitter Switched Thyristor (EST) or the like can be applied. In some cases, a Heterojunction Bipolar Transistor (HBT) and a High Electron Mobility Transistor (HEMT) of compound semiconductors may be used also.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the present invention in practice.

DETAILED DESCRIPTION OF THE INVENTION

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

FIRST EMBODIMENT

Figure 5:
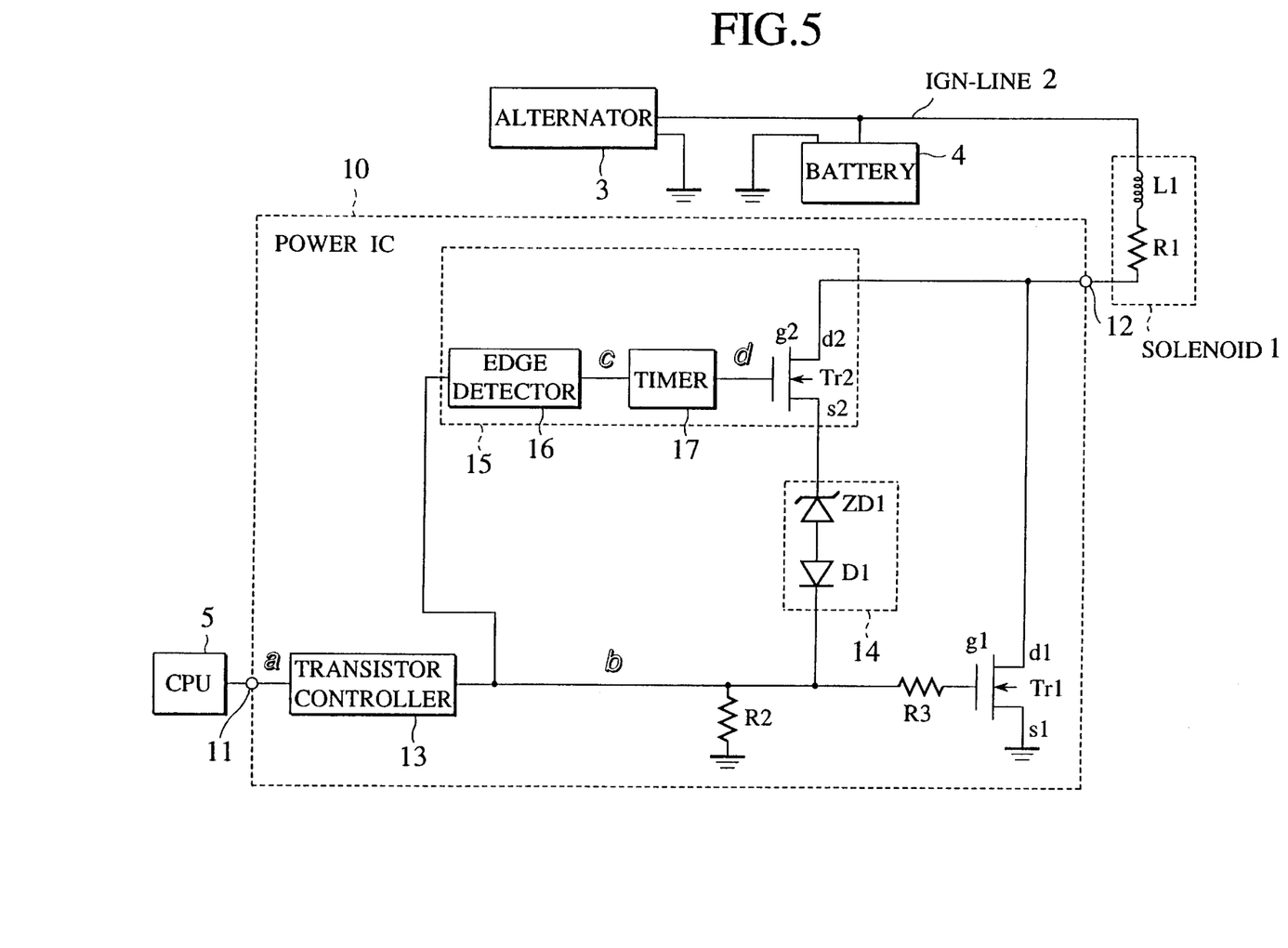
FIG. 5 is a circuit diagram showing a primary section of a power IC according to a first embodiment of the present invention.

FIG. 5 is a circuit diagram showing a constitution of a primary section of a semiconductor integrated circuit according to a first embodiment of the present invention, as well as other parts being connected to this semiconductor integrated circuit such as the load circuit and a CPU controlling this semiconductor integrated circuit. The semiconductor integrated circuit according to a first embodiment of the present invention is a power IC having an n-channel power MOSFET as the output semiconductor element. The output semiconductor element is called "the output transistor" as in the first embodiment.

That is, the power IC 10 according to the first embodiment of the present invention mounts a semiconductor element controller (hereinafter referred to as "a transistor controller") 13 controlling the on/off-states of the output transistor Tr1; a clamping circuit 14 for protecting the output transistor Tr1; and the clamp controlling circuit 15, or the like, on the same chip with the output transistor Tr1. The clamping circuit 14 is a circuit for protecting the output transistor Tr1 from the surge voltage being supplied through the output terminal 12 and is constituted by "an overvoltage protection element" conducting over the given voltage. As the overvoltage protection element, the Zener diode is preferable. Specifically, as shown in FIG. 5, the clamping circuit 14 is constituted by a diode D1 and a Zener diode ZD1 connected in series with their respective anode sides joined together.

An inductive load 1 is connected to the drain D1 of the output transistor Tr1. The solenoid 1, as this inductive load, comprises the inductance component L1 and the resistance component R1, and is connected to the alternator 3 and the battery 4 by the IGN-line 2. The output terminal 11 of the power IC 40 is connected to a CPU 5 arranged outside the power IC 40. The transistor controller 13 is driven by the control signal transferred from the CPU 5 to the power IC 40 through the output terminal 11. The output transistor Tr1 is switched by the transistor controller 13, so that the solenoid 1, connected to the output terminal of the output transistor Tr1, is driven by the drain current of the output transistor Tr1. The transistor controller 13 is connected to the resistance R2 having the other side thereof grounded. The transistor controller 13 is further connected to the cathode side of the diode D1 of the clamping circuit 14 and to the resistor R3.

The other side of the resistor R3 is connected to the gate g1 of the output transistor Tr1. One of the main electrodes, or the drain d1 of the output transistor Tr1, is connected to the output terminal 12 and to the cathode side of the Zener diode ZD1 of the clamping circuit 14, and another main electrode, or the source s1, is grounded. The clamp controlling circuit 15 is connected between the cathode side of the Zener diode ZD1 of the clamping circuit 14 and the drain d1 of the output transistor Tr1.

This clamp controlling circuit 15 is constituted by an edge detector 16, a timer 17 and a switching element (Tr2) connected between the output terminal 12 and the clamping circuit 14. The switching element Tr2 in the first embodiment of the present invention is an n-channel power MOSFET (hereinafter referred to as "a switching transistor", in addition, more generally, it is as a matter of course that a thyristor or the like can also be used as the switching element). An input side of the edge detector 16 is connected to an output of the transistor controller 13 and an output side thereof is connected to the timer 17. The edge detector 16 detects the trailing edge of the transistor controller 13 to send an edge detection signal to the timer 17. The output of the timer 17 is connected to a gate g2 of the switching transistor Tr2. A source s2 of the switching transistor Tr2 is connected to the Zener diode ZD1 of the clamping circuit 14. And the drain d2 of the switching transistor Tr2 is connected to the output terminal 12 and the drain d1 of the output transistor Tr1.

Figure 6:
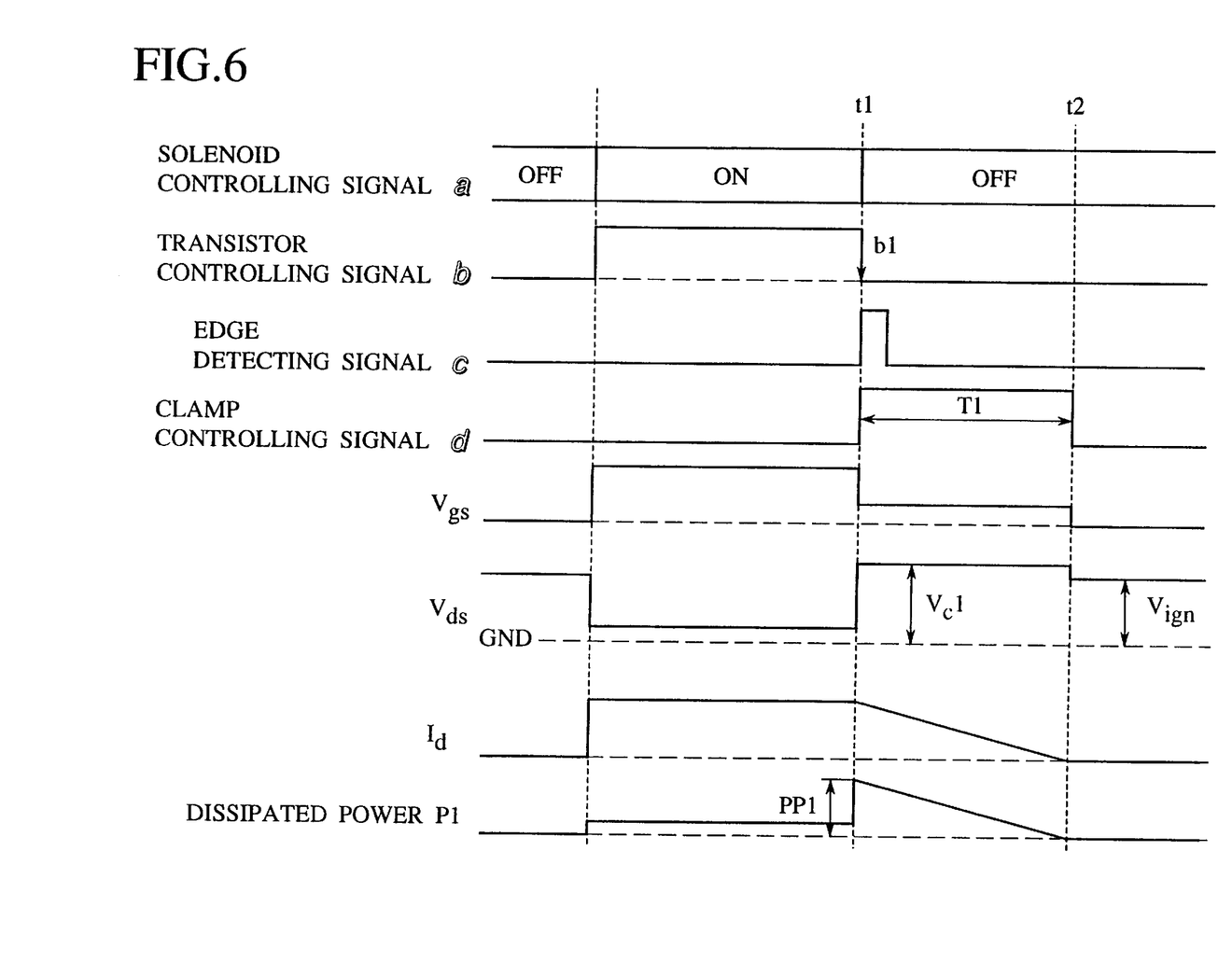
FIG. 6 is a timing chart showing changes with time of each signal in the power IC shown in FIG. 4A.

An operation of the power IC 10 according to the first embodiment of the present invention is described using a timing chart shown in FIG. 6. In order to control the solenoid 1, the solenoid controlling signal "a" is sent to the power IC 10 from the CPU 5. In accordance with an "on-signal" and an "off-signal" of the solenoid controlling signal "a" transferred from this CPU 5, the transistor controller 13 sends a transistor controlling signal "b" turning the output transistor Tr1 to the on-/off-state.

As shown in FIG. 6, at this point of time, since the clamp controlling signal "d" is in the "low level", the switching transistor Tr2 is in a cut-off state. Since the clamping circuit 14 is disconnected from the output terminal 12 by the switching Tr2, an output terminal voltage can not be clamped by the clamping circuit 14 regardless of whether the solenoid of the load is in the on-state or is in the off-state.

At a time t1 when the transistor controlling signal "b" is switched from the "high level" to the "low level", the edge detector 16 of the clamp controlling circuit 15 detects an trailing edge "b1" of the transistor controlling signal "b" of the transistor controller 13 to send a pulse-shaped edge detection signal "c" to the timer 17.

When the edge detection signal "c" is entered, the timer 17 sends the clamp controlling signal "d" for turning the gate potential of the switching transistor Tr2 into the "high level" for a given period T1.

The period T1 is set by determining a time required for the output transistor Tr1 to absorb the surge voltage induced in the solenoid 1 in consideration of the design margin. Accordingly, the gate potential of the switching transistor Tr2 is held at the "high level" for the given period T1, whereby the switching transistor Tr2 keeps a conduction state. As a result, the cathode side of the Zener diode ZD1 of the clamping circuit 14 and the output terminal 12 and the drain d1 of the output transistor Tr1 are connected during the period T1.

After completion of the period T1, at the timing t2 when the clamp controlling signal "d" turns into the "low level", the switching transistor Tr2 turns to the off-state. That is, the clamping circuit 14 is connected between the output terminal 12 and the gate g1 of the output transistor Tr1 only for the period T1 when the clamp controlling signal "d", in the "high level", is sent from the timer 17 so that the switching transistor Tr2 is allowed to be in the on-state, enabling the voltage supplied to the output terminal 12 to be clamped. Moreover, except for the period T1, the switching transistor Tr2 is held to be in the off-state by the clamp controlling signal "d" in the "low level", whereby the clamping circuit 14 does not operate.

Figure 7:
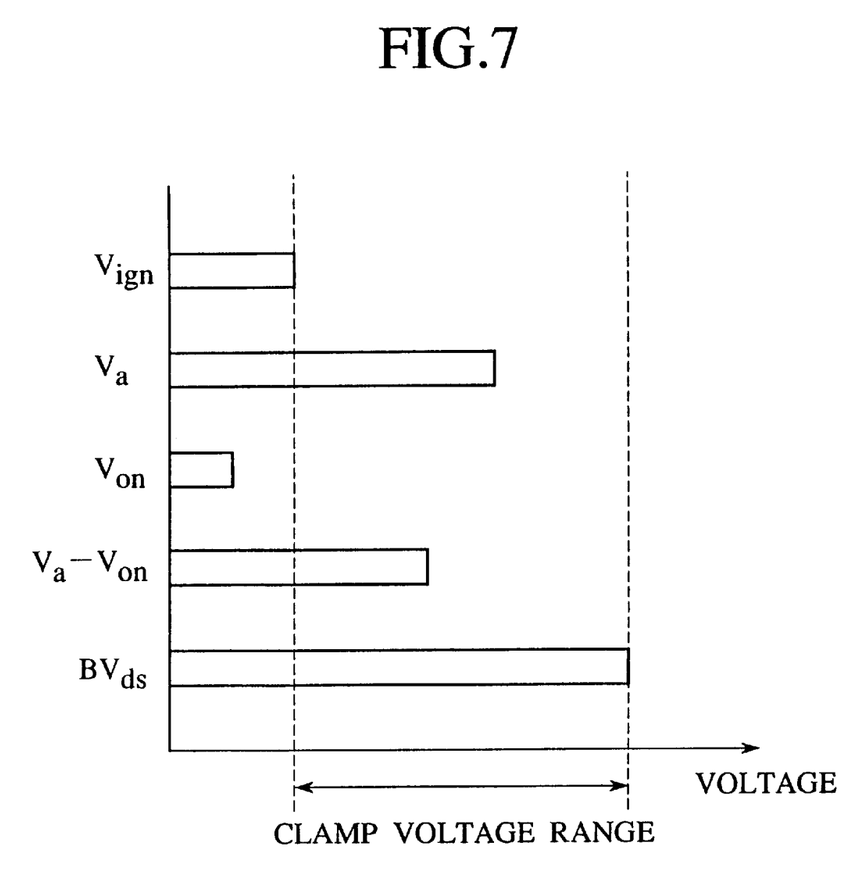
FIG. 7 is a view illustrating a range of a clamp voltage of a power IC according to a first embodiment of the present invention.

At this point, the range of a clamping voltage $V_c1$ of the clamping circuit 14 is described using FIG. 7.

The clamping circuit 14 is connected between the output terminal 12 and the gate of the output transistor Tr1 only for the period T1 when the output transistor Tr1 is supposed to absorb the surge voltage induced in the solenoid. On the other hand, the clamping circuit 14 is disconnected from the output terminal 12, except for the period T1, by the non-conducting switching transistor Tr2. Therefore, the clamping voltage $V_c1$ is suitable when higher than the IGN-line normal voltage $V_{ign}$, and there is no harm even though lower than the difference $(V_a - V_{on})$ between an overvoltage $V_a$ from the alternator 3 and a solenoid on-voltage $V_{on}$. Accordingly, the minimum of the clamping voltage $V_c1$ becomes the IGN-line normal voltage $V_{ign}$. Moreover, the maximum of the clamping voltage $V_c1$ is the breakdown voltage $BV_{ds}$ between the drain and the source of the output transistor Tr1.

Accordingly, according to the first embodiment of the present invention, in order to suppress generation of heat in the power IC 10, a voltage which is approximately equal to the IGN-line normal voltage $V_{ign}$ as the minimum, and some what higher than the IGN-line normal voltage $V_{ign}$ in consideration of a voltage error, can be set as the clamping voltage $V_c1$.

Figure 8A:
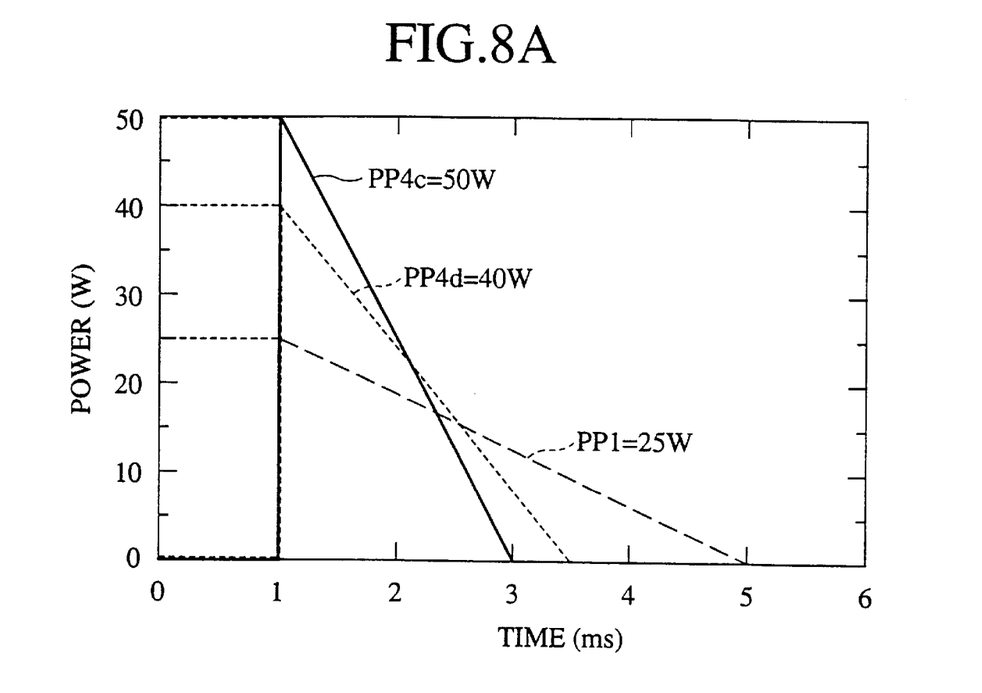
FIG. 8A is a view showing changes with time of power dissipated by a transistor in the power IC according to a first embodiment of the present invention.
Figure 8B:
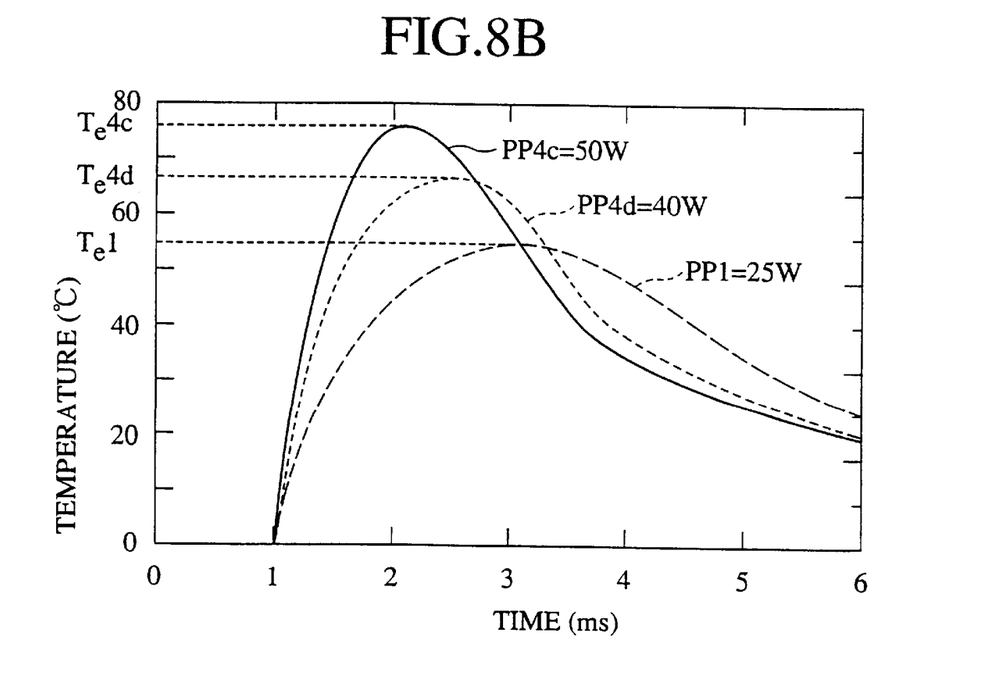
FIG. 8B is a view showing an increase in substrate temperature with the power shown in FIG. 8A.

Returning to FIG. 6, the description is continued. The $V_{ds}$ between the drain and the source of the output transistor Tr1 is kept in the clamping voltage $V_c1$, which is approximately equal to the IGN-line normal voltage $V_{ign}$, for the period T1 when the clamping circuit 14 is connected thereto. Moreover, after completion of the period T1, the $V_{ds}$ between the drain and the source of the output transistor Tr1 becomes the IGN-line normal voltage $V_{ign}$, when the clamping circuit 14 is disconnected from the output terminal 12. That is, the drain d1 of the output transistor Tr1 is electrically isolated by the cut-off state switching transistor Tr2. Since the clamping voltage $V_c1$ can be set lower than the clamping voltage $V_c4$ in the conventional power IC, the value of the peak power value PP1 of the first embodiment becomes smaller than the peak power value PP4 in the conventional power IC. When the surge energy absorbed by the output transistor Tr1 is the same, the time required for the output transistor Tr1 to absorb the surge voltage, that is, the period T1, becomes longer than the period T4 in the conventional power IC, since the period is inversely proportional to the peak power value. FIG. 8A shows changes with time (a transient response) of power dissipated by the transistor at the peak power PP1 of the present invention, and FIG. 8B shows changes with time (a transient response) in substrate temperature of the power IC. In FIG. 8A and FIG. 8B, the transient responses to the peak powers PP4c and PPRd for the conventional power IC are also included. It is understood that, when the peak power value PP1 is 25 W and the period T1 is 4 ms, the increase of substrate temperature ($T_e1$) of the power IC 10 is suppressed to a level of 54° C.

As described above, by the semiconductor integrated circuit according to the first embodiment of the present invention, the clamping circuit 14 can be electrically connected to the output terminal 12 only for a period of when the solenoid 1 turns off and the surge voltage by the back electromotive voltage is supposed to be supplied to the output terminal 12. On the other hand, except for the period T1, the clamping circuit 14 can be electrically disconnected from the output terminal 12. Therefore, the clamping voltage $V_c1$ of the clamping circuit 14 can be set in a manner to reduce approximately to the normal voltage of the IGN-line. Accordingly, the peak power value of the power loss dissipated by the transistor can be set smaller. Since the increase in junction temperature of the semiconductor integrated circuit is reduced, cross-sectional area available for the heat transportation in the semiconductor integrated circuit can be reduced, even though the heat dissipation effect is decreased.

That is, by the semiconductor integrated circuit according to the first embodiment of the present invention, by the simplified circuit configuration, reduction of the chip size can be performed. In addition, the output transistor can be effectively protected from the surge voltage generated in the external circuit, or the load.

SECOND EMBODIMENT

Figure 9:
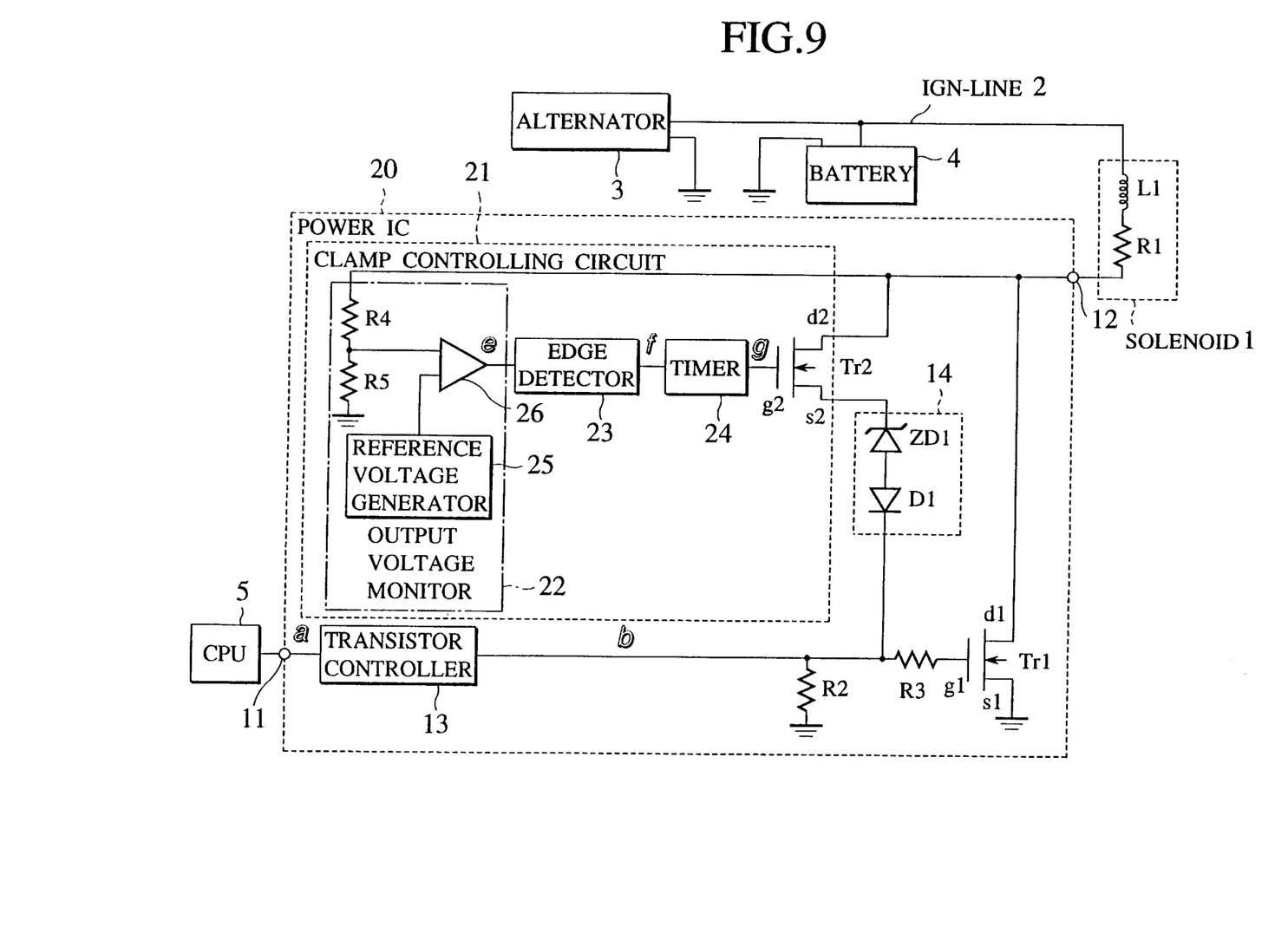
FIG. 9 is a circuit diagram showing a primary section of a power IC according to a second embodiment of the present invention.

As shown in FIG. 9, a semiconductor integrated circuit (a power IC) 20 according to a second embodiment of the present invention mounts a semiconductor element controller (a transistor controller) 13; a clamping circuit 14; and a clamp controlling circuit 21, or the like, on the same chip with the output semiconductor element (an output transistor Tr1). In the second embodiment of the present invention, the constitution of the clamp controlling circuit 21 differs from the first embodiment of the present invention.

That is, the clamp controlling circuit 21 according to a second embodiment of the present invention is constituted by an output voltage monitor 22; an edge detector 23; and a timer 24 as shown in FIG. 9. Furthermore, the clamp controlling circuit 21 comprises a switching element Tr2 connected between the output terminal 12 and the clamping circuit 14. The output voltage monitor 22 is constituted by a reference voltage generator 25 sending a reference voltage; a first resistor R4 connected to the output terminal 12; a second resistor R5 connected between the first resistor R4 and ground; and a comparator 26. The comparator 26 compares the voltage of the output terminal 12, divided by the first resistor R4 and the second resistor R5, with the reference voltage generated in the reference voltage generator 25.

Values of the first resistor R4 and the second resistor R5 of the output voltage monitor 22 and the reference voltage of the reference voltage generator 25 are set such that, when the output terminal voltage becomes higher than a given surge determination level $V_s$, an output signal of the comparator 26 changes from the "high level" to the "low level". The surge determination level $V_s$ is set at a value higher than the overvoltage from the alternator 3 and lower than the breakdown voltage $BV_{ds}$ between the drain and the source of the output transistor Tr1.

The edge detector 23 is connected to an output of the comparator 26 to detect a trailing edge of the output of the comparator 26 and to send an edge detection signal to the timer 24. The output of the timer 24 is connected to a gate electrode of a switching transistor Tr2 as the switching element.

Figure 10:
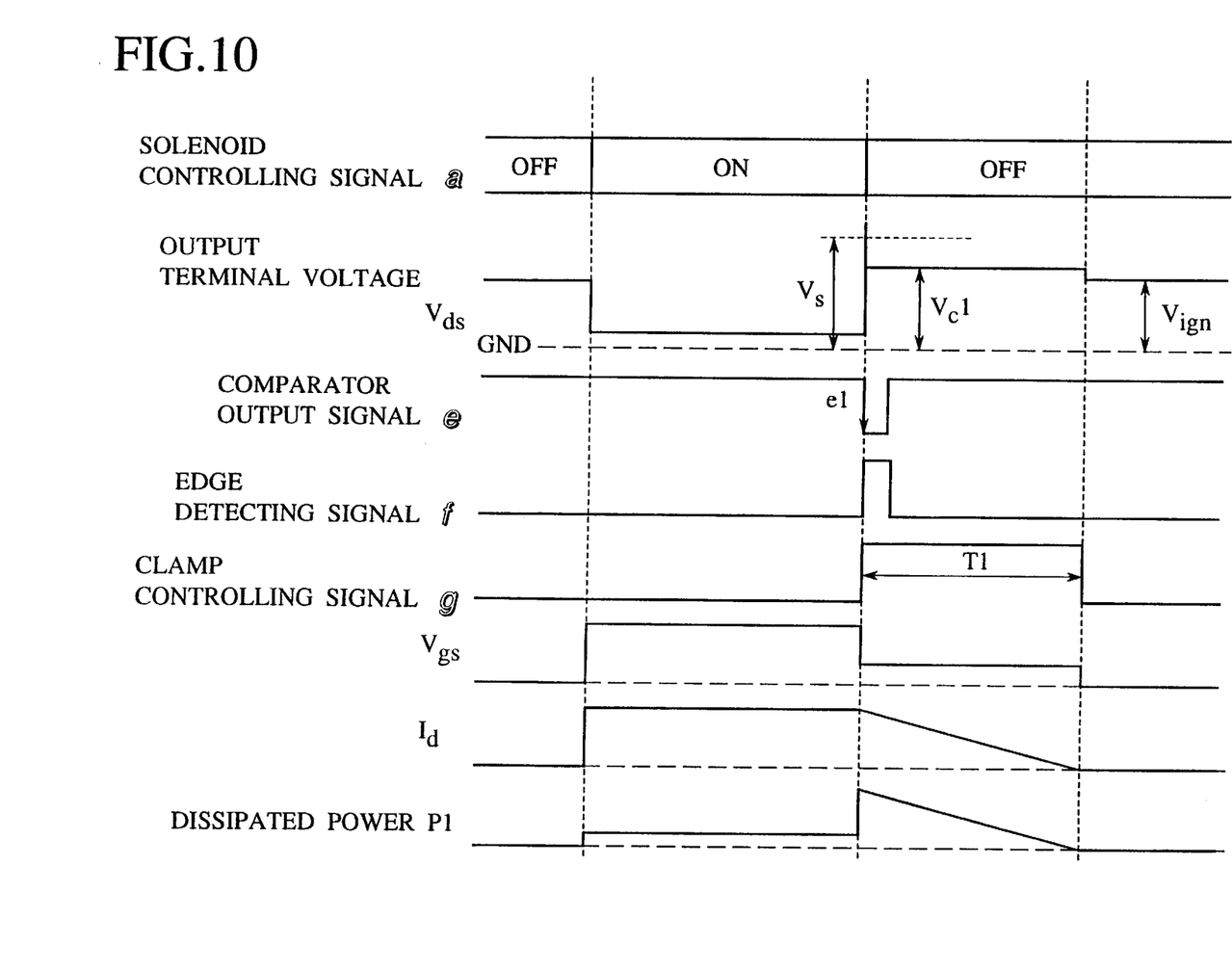
FIG. 10 is a timing chart showing changes with time of each signal in the second embodiment of the present invention.

An operation of the power IC 20 according to the second embodiment of the present invention is described using a timing chart shown in FIG. 10.

The solenoid controlling signal "a" is sent to the power IC 10 from the CPU 5, and the solenoid controlling signal "a" is transmitted to the transistor controller 13 through the input terminal 11. As shown in FIG. 10, when the solenoid controlling signal "a" is switched from the "on-signal" to the "off-signal", the transistor controller 13 sends a transistor controlling signal "b" turning the output transistor Tr1 to the on-/off-state. When the transistor controlling signal "b" is switched from the "high level" to the "low level", the output transistor Tr1 also is switched from the on-state to the off-state. When the output transistor Tr1 also is switched from the on-state to the off-state, the back electromotive voltage is induced in the inductance component L1 (which the solenoid 1 has) such that the surge voltage, due to the back electromotive voltage, is supplied to the output terminal 12.

When the surge voltage supplied to the output terminal 12 becomes higher than the surge determination level $V_s$, a comparator output signal "e", sent from the comparator 26, is switched from the "high level" to the "low level". The edge detector 23 detects a trailing edge "e1" of the comparator output signal "e" to send a pulse-shaped edge detection signal "f" to the timer 24. When the edge detection signal "f" is entered, for a given period T1, the timer 24 sends a clamp controlling signal "g" for turning the potential at the gate g2 of the switching transistor Tr2 to the "high level".

Similar to the first embodiment, the clamping circuit 14 is connected between the output terminal 12 and the gate of the output transistor Tr1 only for the period T1 when the clamp controlling signal "g", in the "high level", is sent from the timer 24. Then, the switching transistor Tr2 is allowed to be in the on-state during the period T1, whereby the voltage supplied to the output terminal 12 is clamped. Moreover, except for the period T1, the switching transistor Tr2 is kept to be in the off-state, whereby the clamping circuit 14 does not operate.

Other constitution and the operation are the same as the first embodiment.

In the second embodiment, the clamping circuit 14 is designed to operate when the voltage exceeding the surge determination level $V_s$ is supplied to the output terminal, whereby the output transistor Tr1 can be protected from breakdown by the overvoltage, in addition to the effect of the first embodiment, even though the surge voltage caused by static electricity is supplied, except the surge voltage induced by turning the solenoid 1 off.

THIRD EMBODIMENT

Figure 11:
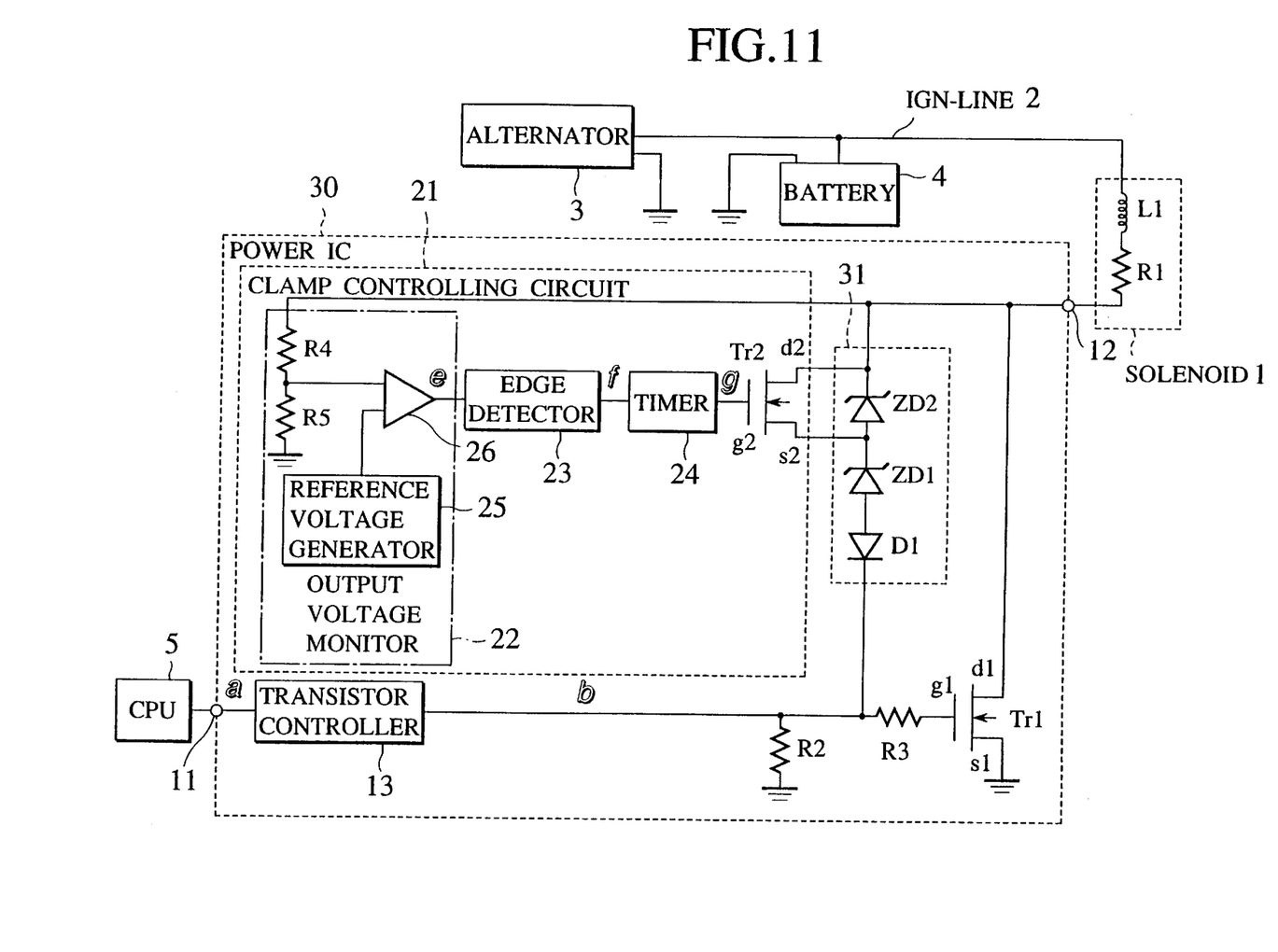
FIG. 11 is a circuit diagram showing a primary section of a power IC according to a third embodiment of the present invention.

As shown in FIG. 11, a semiconductor integrated circuit (a power IC) 30 according to a third embodiment of the present invention mounts a semiconductor element controller (a transistor controller) 13; a clamping circuit 31; and a clamp controlling circuit 21, or the like, on the same chip with the output semiconductor element (an output transistor Tr1). In the third embodiment of the present invention, the constitution of the clamp controlling circuit 31 differs from the first and the second embodiments of the present invention. The third embodiment of the present invention is the same as the second embodiment in the point that the clamp controlling circuit 21 is constituted by an output voltage monitor 22, an edge detector 23, a timer 24 and the switching element Tr2.

As shown in FIG. 11, a clamping circuit 31 of a power IC 30 according to a third embodiment of the present invention is constituted by a diode D1; a first overvoltage protection element (a Zener diode) ZD1; and a second overvoltage protection element (a Zener diode) ZD2. That is, the clamping circuit 31 of a power IC 30 according to a third embodiment of the present invention is constituted by a plurality of overvoltage protection elements connected in series. An anode side of the second Zener diode ZD2 is connected to a cathode side of the first Zener diode ZD1 and a source s2 of a switching element (a switching transistor) Tr2 of the clamp controlling circuit 32. In addition, a cathode side of the second Zener diode ZD2 is connected to a drain d2 of the switching element (the switching transistor) Tr2 and the output terminal 12. The anode side of the first Zener diode ZD1 is connected to the anode side of the diode D1. The cathode side of the diode D1 is connected to the transistor controller 13, resistors R2 and R3.

When the switching transistor Tr2 is in the on-state, the clamping circuit 31 clamps the voltage in the output terminal 12 by the clamping voltage $V_c1$ in the same way as the first embodiment, since the second Zener diode ZD2 does not exert an influence upon a clamping operation.

When the switching transistor Tr2 is in the off-state, the second Zener diode ZD2 is added to the clamping circuit 31, whereby a clamping voltage $V_c2$ becomes $$V_c2 = V_c1 + V_z2 \tag{15}$$

when defining a Zener voltage of the second Zener diode ZD2 as $V_z2$. When defining an overvoltage of the alternator 3 as $V_a$, an on-voltage of the solenoid as $V_{on}$ and a breakdown voltage between the drain and the source of the output transistor Tr1 as $BV_{ds}$, the Zener voltage $V_z2$ of he second Zener diode ZD2 is set such that the clamping voltage $V_c2$ becomes $$V_a - V_{on} < V_c2 < BV_{ds} \tag{16}$$

In the third embodiment, even though the clamp controlling circuit 21 does not operate, the second Zener diode ZD2 is forced into conduction, thereby the clamping operation is performed. Accordingly, the output transistor Tr1 can be protected from breakdown by the overvoltage, in addition to the effect of the second embodiment, even though the power supply of the power IC 30 were kept in the off-state, so that the clamp controlling circuit 21 would not operate.

As described above, according to the semiconductor integrated circuit of the present invention, the peak power value of the power loss dissipated by the transistor can be reduced. Therefore, the increase in substrate temperature of the semiconductor integrated circuit can be reduced, whereby the semiconductor integrated circuit can be reduced in chip size as far as operating within a working temperature range, even though the heat dissipation effect is decreased.

Moreover, the operation of the clamping circuit can be controlled approximately in parallel with a turn-off of the transistor, whereby high reliability in the claming operation can be maintained.

OTHER EMBODIMENTS

Various modifications will become possible for those skilled in the art after receiving the teaching of the present disclosure without departing from the scope thereof.

For example, as the switching element of the present invention, other semiconductor elements such as BJT and SIT, except the n-channel power MOSFET shown in the first and the second embodiments, can be used. It is to be understood that reversing all n-type and p-type MOS transistors shown in the first and the second embodiments and reversing the polarities of the signals is permissible. When the output transistor Tr1 and the switching element Tr2 are p-channel MOS transistors, the leading edge should be detected in the edge detector 16 shown in FIG. 5.

Moreover, although the power IC is illustrated in the described-above the first and second embodiments, the semiconductor integrated circuit of the present invention may be an integrated circuit for a small signal. That is, whatever structure which is capable of connecting a load to the main electrode of the output semiconductor element can be applicable in the invention. Accordingly, a semiconductor material may be silicon or a compound semiconductor such as gallium arsenide (GaAs).

What is claimed is:

1. A semiconductor circuit comprising:
   a power switch having a control terminal and first and second main terminals;
   a power switch control circuit coupled to the control terminal for sending turn-on and turn-off signals alternatively to the control terminal;
   a clamp coupled to the control terminal for preventing a voltage across the first and second main terminals from exceeding a breakdown voltage of the power switch; and
   clamp control means coupled between the clamp and one of the first and second main terminals for detecting an end of the turn-on signal and making the clamp active only for a given period following the end of the turn-on signal.

2. The semiconductor circuit of claim 1, wherein said clamp control means comprises:
   an edge detector for detecting a pulse edge at an end of the turn-on signal; and
   a timer sending a signal for making the clamp active for the given period, after detecting the pulse edge by the edge detector.

3. The semiconductor circuit of claim 2, wherein said clamp control means further comprises:
   a clamp switch connected between said one of the first and second main terminals and said clamp.

4. The semiconductor circuit of claim 1, wherein said clamp clamps a surge voltage induced by an inductive load being adapted for connection to said one of the first and second main terminals.

5. The semiconductor circuit of claim 3, wherein said clamp comprises a overvoltage protection element.

6. The semiconductor circuit of claim 5, wherein said overvoltage protection element comprises a Zener diode.

7. The semiconductor circuit of claim 5, wherein said clamp further comprises a diode connected in series with the overvoltage protection element.

8. An integrated circuit having an output terminal configured to be connected to an inductive load and an input terminal configured to be connected to a CPU, the input terminal receives a control signal from the CPU, comprising:
   a power switch having a control terminal and first and second main terminals, one of the first and second main terminals being connected to the output terminal;

a power switch control circuit having an input node coupled to the input terminal and an output node coupled to the control terminal, for sending turn-on and turn-off signals alternatively to the control terminal;

a clamp coupled to the control terminal, for preventing a voltage across the first and second main terminals from exceeding a predetermined voltage;

a clamp switch having a control electrode, the clamp switch being coupled between the output terminal and the clamp; and a clamp switch control circuit coupled between the output node and the control electrode, for detecting an end of the turn-on signal and making the clamp switch conductive only for a duration following the end of the turn-on signal.

9. The integrated circuit of claim 8, wherein said clamp switch control circuit comprises:

an edge detector for detecting a pulse edge at an end of the turn-on signal; and a timer sending a signal to the control electrode for making the clamp switch conductive for the duration, after detecting the pulse edge.

10. An overvoltage protection circuit coupled between one of first and second main terminals and a control terminal of a power switch, for preventing a voltage across the first and second main terminals from exceeding a predetermined voltage, comprising:

a series circuit configured to be coupled between one of the first and second main terminals and the control terminal, the series circuit including a clamp and a clamp switch connected in series with the clamp, the clamp switch having a control electrode; and a clamp switch control circuit configured to be coupled between the control electrode and the control terminal, the clamp switch control circuit for detecting an end of a turn-on signal to be supplied to the control terminal and making the clamp switch conductive only for a duration following the end of the turn-on signal.

11. The overvoltage protection circuit of claim 10, wherein said clamp switch control circuit comprises:

an edge detector for detecting a pulse edge at an end of the turn-on signal; and a timer sending a signal to the control electrode for making the clamp switch conductive for the duration, after detecting the pulse edge.

12. A semiconductor circuit comprising:

a power switch having a control terminal and first and second main terminals;

a power switch control circuit coupled to the control terminal for sending turn-on and turn-off signals alternatively to the control terminal;

a clamp coupled to the control terminal for preventing a voltage across the first and second main terminals from exceeding a breakdown voltage of the power switch; and a clamp controller coupled between the clamp and one of the first and second main terminals, the clamp controller detecting an end of the turn-on signal and making the clamp active only for a given period following the end of the turn-on signal.

13. The semiconductor circuit of claim 12, wherein said clamp controller includes:

an edge detector for detecting a pulse edge at an end of the turn-on signal, and a timer sending a signal for making the clamp active for the given period, after detecting the pulse edge by the edge detector.

14. The semiconductor circuit of claim 13, wherein said clamp controller further includes:

a clamp switch connected between said one of the first and second main terminals and said clamp.

15. The semiconductor circuit of claim 12, wherein said clamp clamps a surge voltage induced by an inductive load being adapted for connection to said one of the first and second main terminals.

16. The semiconductor circuit of claim 14, wherein said clamp comprises a overvoltage protection element.

17. The semiconductor circuit of claim 16, wherein said overvoltage protection element comprises a Zener diode.

18. The semiconductor circuit of claim 16, wherein said clamp further comprises a diode connected in series with the overvoltage protection element.

19. An integrated circuit having an output terminal configured to be connected to an inductive load and an input terminal configured to connected to a CPU, the input terminal receives a control signal from the CPU, comprising:

a power switch having a control terminal and first and second main terminals, one of the first and second main terminals being connected to the output terminal;

a power switch control circuit having an input node coupled to the input terminal and an output node coupled to the control terminal, for sending turn-on and turn-off signals alternatively to the control terminal;

a clamp coupled to the control terminal and preventing a voltage across the first and second main terminals from exceeding a predetermined voltage;

a clamp switch having a control electrode, the clamp switch being coupled between the output terminal and the clamp; and a clamp switch controller coupled between the output node and the control electrode, the clamp switch controller detecting an end of the turn-on signal and making the clamp switch conductive only for a duration following the end of the turn-on signal.

20. The integrated circuit of claim 19, wherein said clamp switch controller comprises:

an edge detector detecting a pulse edge at an end of the turn-on signal; and a timer sending a signal to the control electrode and making the clamp switch conductive for the duration, after detecting the pulse edge.

21. An overvoltage protection circuit coupled between one of first and second main terminals and a control terminal of a power switch, for preventing a voltage across the first and second main terminals from exceeding a predetermined voltage, comprising:

a series circuit configured to be coupled between one of first and second main terminals and the control terminal, the series circuit including a clamp and a clamp switch connected in series with the clamp, the clamp switch having a control electrode; and a clamp switch controller configured to be coupled between the control electrode and the control terminal, the clamp switch control circuit detecting an end of a turn-on signal to be supplied to the control terminal and making the clamp switch conductive only for a duration following the end of the turn-on signal.

22. The overvoltage protection circuit of claim 21, wherein said clamp switch control circuit comprises:

an edge detector detecting a pulse edge at an end of the turn-on signal; and a timer sending a signal to the control electrode and making the clamp switch conductive for the duration, after detecting the pulse edge.

* * * * *